(12) United States Patent
Kim

(10) Patent No.: US 10,050,017 B2
(45) Date of Patent: Aug. 14, 2018

(54) SEMICONDUCTOR APPARATUS AND SEMICONDUCTOR SYSTEM INCLUDING THE SAME

(71) Applicant: SK hynix Inc., Icheon-si Gyeonggi-do (KR)

(72) Inventor: Kwan Dong Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/483,444

(22) Filed: Apr. 10, 2017

(65) Prior Publication Data

US 2018/0068981 A1 Mar. 8, 2018

(30) Foreign Application Priority Data

Sep. 5, 2016 (KR) .................. 10-2016-0113798

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 25/065* | (2006.01) | |
| *H01L 23/00* | (2006.01) | |

(52) U.S. Cl.
CPC .......... *H01L 25/0655* (2013.01); *H01L 24/06* (2013.01); *H01L 24/16* (2013.01); *H01L 24/48* (2013.01); *H01L 2224/0401* (2013.01); *H01L 2224/04042* (2013.01); *H01L 2224/16146* (2013.01); *H01L 2224/16235* (2013.01); *H01L 2224/48145* (2013.01); *H01L 2224/48227* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06548* (2013.01); *H01L 2225/06586* (2013.01)

(58) Field of Classification Search
CPC . H01L 2224/04042; H01L 2224/48105; H01L 2225/06506; H01L 2224/49176
USPC ................................ 257/784, 786, 686, 777
See application file for complete search history.

(56) References Cited

U.S. PATENT DOCUMENTS

| | | | |
|---|---|---|---|
| 5,120,421 A * | 6/1992 | Glass ..................... | G01N 27/27 204/400 |
| 8,417,870 B2 | 4/2013 | Lee et al. | |
| 8,756,364 B1 | 6/2014 | Bhakta et al. | |
| 2009/0027366 A1* | 1/2009 | Kim ..................... | G09G 3/3685 345/204 |
| 2010/0244175 A1* | 9/2010 | Park .................. | H01L 27/14636 257/459 |
| 2013/0020647 A1* | 1/2013 | Hwang ............. | H01L 27/11565 257/365 |
| 2014/0118055 A1* | 5/2014 | Seok ................. | H01L 29/41741 327/432 |
| 2016/0204111 A1* | 7/2016 | Park .................... | H01L 23/3171 257/324 |

* cited by examiner

*Primary Examiner* — S. V. Clark
(74) *Attorney, Agent, or Firm* — William Park & Associates Ltd.

(57) ABSTRACT

A semiconductor apparatus may include a package substrate, and a plurality of semiconductor chips. Wherein the package substrate and the semiconductor chips may be configured based on a load value of the semiconductor apparatus.

19 Claims, 7 Drawing Sheets

SEMICONDUCTOR APPARATUS AND SEMICONDUCTOR SYSTEM INCLUDING THE SAME

CROSS-REFERENCES TO RELATED APPLICATION

The present application claims priority under 35 U.S.C. § 119(a) to Korean application number 10-2016-0113798, filed on Sep. 5, 2016, in the Korean Intellectual Property Office, which is incorporated herein by reference in its entirety.

BACKGROUND

1. Technical Field

Various embodiments may generally relate to a semiconductor technology, and, more particularly, to a semiconductor apparatus and a system including the same.

2. Related Art

As the capacities and the degrees of integration of semiconductor apparatuses are increased, various types of stack semiconductor apparatuses are being developed. In a stack semiconductor apparatus, a plurality of chips may be electrically coupled through wires or through electrodes and may be packaged into a single package. A semiconductor apparatus may operate by being coupled with an external device through pads. In the case where the number of chips configuring a semiconductor apparatus is small, then a loading to be coupled with a pad is not considered large and communication between an external device and the semiconductor apparatus may be performed relatively smoothly. However, as the number of chips configuring a semiconductor apparatus increases and a loading to be coupled with a pad increases, a problem may be caused whereby precise communication may not be able to be performed.

SUMMARY

In an embodiment, a semiconductor apparatus may be provided. The semiconductor apparatus may include a package substrate, and a plurality of semiconductor chips. Wherein the package substrate and the semiconductor chips may be configured based on a load value of the semiconductor apparatus.

DETAILED DESCRIPTION

Hereinafter, a semiconductor apparatus and a semiconductor system including the same will be described below with reference to the accompanying drawings through various examples of embodiments.

Figure 1:
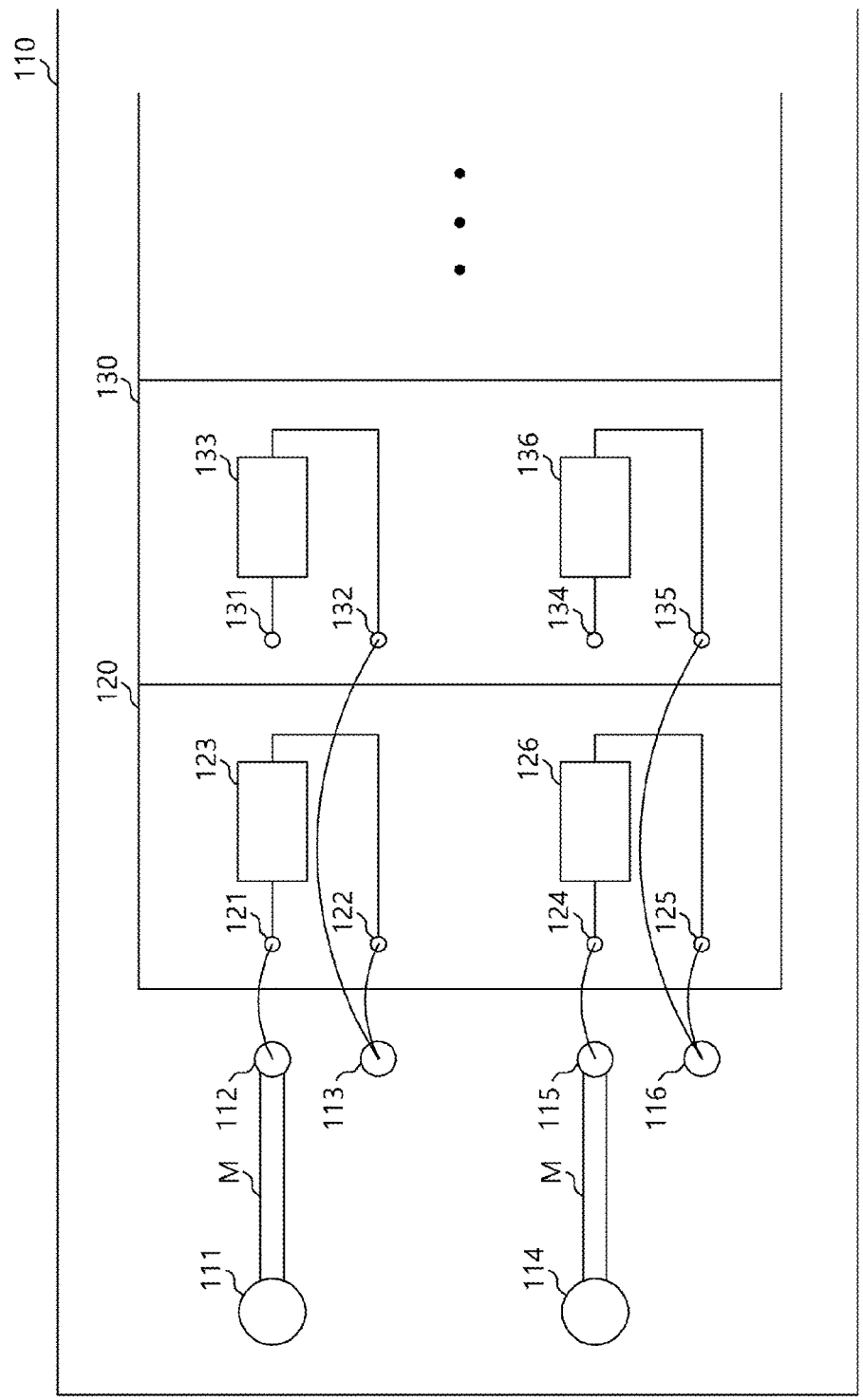
FIG. 1 is a diagram illustrating a representation of an example of the configuration of a semiconductor apparatus in accordance with an embodiment.

FIG. 1 is a diagram illustrating a representation of an example of the configuration of a semiconductor apparatus 100 in accordance with an embodiment. FIG. 1 is a plan view illustrating conceptually the configuration of a present embodiment. Referring to FIG. 1, the semiconductor apparatus 100 may include a package substrate 110 and a first semiconductor chip 120. The package substrate 110 may include a first package ball 111, a first substrate pad 112, and a second substrate pad 113. The first package ball 111 may be coupled with an external device (not illustrated). The first substrate pad 112 may be coupled with the first package ball 111. The first substrate pad 112 may be coupled with the first package ball 111 through electrical coupling means such as, for example but not limited to, a metal line M.

The first semiconductor chip 120 may include a first main pad 121, a first auxiliary pad 122, and a first buffer 123. The first main pad 121 may be coupled with the first substrate pad 112. The first main pad 121 may be wire-bonded with the first substrate pad 112. The first auxiliary pad 122 may be wire-bonded with the second substrate pad 113. In the present detailed description, "couple" may be used as a term that may include all electrical coupling relationships using bonding wires, through electrodes, through-silicon vias or the likes, and may be used as a term that includes not only a case where two components are coupled directly but also a case where two components are coupled indirectly through another component or other components. 'Wire bonding' may be used as a term that means a case where two components are coupled directly by using bonding wires. The first buffer 123 may be coupled between the first main pad 121 and the first auxiliary pad 122. The output signal of the first buffer 123 may be provided to the internal circuit of the first semiconductor chip 120.

The semiconductor apparatus 100 may further include a second semiconductor chip 130. The second semiconductor chip 130 may be stacked on the first semiconductor chip 120. The second semiconductor chip 130 may include a second auxiliary pad 132. The second auxiliary pad 132 may be coupled with the second substrate pad 113. The second auxiliary pad 132 may be wire-bonded with the second substrate pad 113.

The first package ball 111 may be coupled with the first main pad 121 of the first semiconductor chip 120 through the first substrate pad 112, and may not be coupled directly or may be indirectly coupled with the second substrate pad 113, the first auxiliary pad 122 and the second auxiliary pad 132. Therefore, the first package ball 111 and the first substrate pad 112 may expect only the loading of the first main pad 121 and the first buffer 123, and the external device coupled with the first package ball 111 may expect only a loading for the first semiconductor chip 120. If a signal is received through the first package ball 111, the first main pad 121 may receive the signal from the first substrate pad 112, and the first buffer 123 may buffer and output the signal. Since the output of the first buffer 123 is coupled with the first auxiliary pad 122 and the first auxiliary pad 122 is coupled with the second substrate pad 113 and the second auxiliary pad 132, the signal buffered by the first buffer 123 may be transmitted to both the first and second semiconductor chips 120 and 130. Conversely, a signal outputted from the internal circuit of any one of the first and second semiconductor chips 120 and 130 may be inputted to the first buffer 123 through the second substrate pad 113 and the first auxiliary pad 122. A signal outputted from the internal circuit of the first semiconductor chip 120 may be inputted to the first buffer 123 through the first auxiliary pad 122, and a signal outputted from the internal circuit of the second semiconductor chip 130 may be inputted to the first buffer 123 sequentially through the second auxiliary pad 132, the second substrate pad 113 and the first auxiliary pad 122. The first buffer 123 may buffer the signal, and output the buffered signal to the external device through the first substrate pad 112 and the first package ball 111. The signal received or outputted through the first package ball 111 may be a bidirectional transmission signal. For example, the bidirectional transmission signal may be data or a data strobe signal. The first buffer 123 may be a bidirectional signal transmission circuit.

The second semiconductor chip 130 may further include a second main pad 131 and a second buffer 133. The second semiconductor chip 130 may be manufactured and fabricated on substantially the same wafer as the first semiconductor chip 120, and may have substantially the same configuration as the first semiconductor chip 120. The second main pad 131 may be coupled with the second buffer 133. While the second main pad 131 may be coupled with the second auxiliary pad 132 through the second buffer 132, the second main pad 131 may not be coupled directly with the first substrate pad 112. The second main pad 131 may not be wire-bonded with the first substrate pad 112.

Referring to FIG. 1, the package substrate 110 may further include a second package ball 114, a third substrate pad 115, and a fourth substrate pad 116. The second package ball 114 may receive a unidirectional transmission signal, and the unidirectional transmission signal may be, for example, a command signal and/or an address signal. The third substrate pad 115 may be coupled with the second package ball 114 through electrical coupling means such as, for example but not limited to, a metal line M.

The first semiconductor chip 120 may further include a third main pad 124, a third auxiliary pad 125, and a third buffer 126. The third main pad 124 may be wire-bonded with the third substrate pad 115. The third auxiliary pad 125 may be wire-bonded with the fourth substrate pad 116. The third buffer 126 may be coupled between the third main pad 124 and the third auxiliary pad 125. The third buffer 126 may provide a signal received through the third main pad 124, to the third auxiliary pad 125 and the fourth substrate pad 116.

The second semiconductor chip 130 may further include a fourth main pad 134, a fourth auxiliary pad 135, and a fourth buffer 136. The fourth auxiliary pad 135 may be wire-bonded with the fourth substrate pad 116. Therefore, the second semiconductor chip 130 may receive a signal received through the second package ball 114, through the third buffer 126 and the third auxiliary pad 125 of the first semiconductor chip 120 and the fourth substrate pad 116. The fourth buffer 136 may couple the fourth main pad 134 and the fourth auxiliary pad 135. The fourth main pad 134 may not be wire-bonded with the third substrate pad 115.

The semiconductor apparatus 100 may further include a plurality of semiconductor chips which are stacked on the package substrate 110 and the first and second semiconductor chips 120 and 130. The plurality of semiconductor chips may include the same configuration as the second semiconductor chip 130, and may have the same electrical coupling relationship as the electrical coupling relationship of the components of the second semiconductor chip 130. The semiconductor apparatus 100 in accordance with a present embodiment allows the external device to expect only the loadings of the main pads 121 and 124 and the buffers 123 and 126 of the first semiconductor chip 120 through the package balls 111 and 114 and not to expect loadings of the other semiconductor chips. Hence, even though the external device is coupled with a semiconductor apparatus in which a plurality of semiconductor chips are stacked, a loading may be reduced as if the external device is coupled with a semiconductor apparatus which includes one semiconductor chip.

A signal received from the external device may be buffered by the first buffer 123, and the buffered signal may be transmitted to the respective semiconductor chips through the second substrate pad 113 and the auxiliary pads 122 and 132. Conversely, a signal outputted from each semiconductor chip may be provided to the first buffer 123 through the auxiliary pads 122 and 132 and the second substrate pad 113, and may be outputted to the external device through the first buffer 123, the first substrate pad 112 and the first package ball 111.

Figure 2:
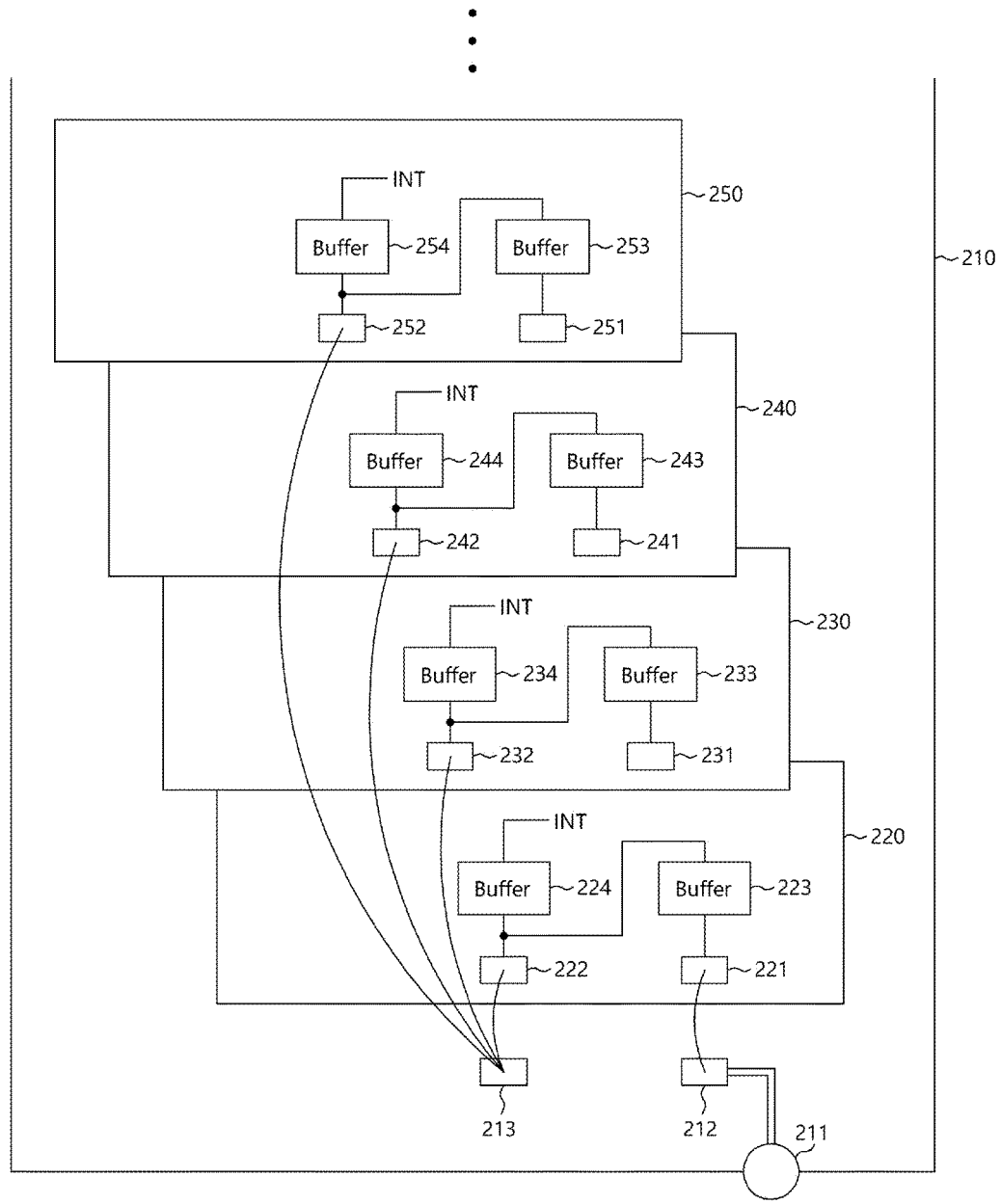
FIG. 2 is a diagram illustrating a representation of an example of the configuration of a semiconductor apparatus in accordance with an embodiment.

FIG. 2 is a diagram illustrating a representation of an example of the configuration of a semiconductor apparatus 200 in accordance with an embodiment. Referring to FIG. 2, the semiconductor apparatus 200 may include a package substrate 210 and a plurality of semiconductor chips. Referring to FIG. 2, it is illustrated that, without a limiting sense, first to fourth semiconductor chips 220, 230, 240 and 250 are stacked. However, it is to be noted that the semiconductor apparatus 200 may include a greater number of semiconductor chips. The package substrate 210 may include a package ball 211, a first substrate pad 212, and a second substrate pad 213. The first substrate pad 212 may be coupled with the package ball 211, and the package ball 211 may be coupled with an external device (not illustrated). The first semiconductor chip 220 may include a first main pad 221, a first auxiliary pad 222, a first buffer 223, and a second buffer 224. The first main pad 221 may be wire-bonded with the first substrate pad 212. The first auxiliary pad 222 may be wire-bonded with the second substrate pad 213. The first buffer 223 may be coupled between the first main pad 221 and the first auxiliary pad 222. The second buffer 224 may be coupled with the first auxiliary pad 222 and the first buffer 223. The second buffer 224 may be coupled also with an internal circuit INT of the first semiconductor chip 220.

The second semiconductor chip 230 may include a second main pad 231, a second auxiliary pad 232, a third buffer 233, and a fourth buffer 234. In order for implementation of a present embodiment, it is sufficient that the second semiconductor chip 230 includes the second auxiliary pad 232 and the fourth buffer 234. Since the first to fourth semiconductor chips 220, 230, 240 and 250 may be manufactured and fabricated through the same processes and have the same configuration, it is illustrated that the second semiconductor chip 230 includes together the configuration of the second main pad 231 and the third buffer 233. The second main pad 231 may not be coupled directly with the first substrate pad 212. That is to say, the second main pad 231 may not be wire-bonded with the first substrate pad 212. The second auxiliary pad 232 may be wire-bonded with the second substrate pad 213. The third buffer 233 may be coupled between the second main pad 231 and the second auxiliary pad 232. The fourth buffer 234 may be coupled with the second auxiliary pad 232 and the third buffer 233. The fourth buffer 234 may be coupled also with an internal circuit INT of the second semiconductor chip 230.

The third semiconductor chip 240 may include a third main pad 241, a third auxiliary pad 242, a fifth buffer 243, and a sixth buffer 244. In order for implementation of a present embodiment, it is sufficient that the third semiconductor chip 240 includes the third auxiliary pad 242 and the sixth buffer 244. Since the first to fourth semiconductor chips 220, 230, 240 and 250 may be manufactured and fabricated through the same processes and have the same configuration, it is illustrated that the third semiconductor chip 240 includes together the configuration of the third main pad 241 and the fifth buffer 243. The third main pad 241 may not be coupled directly with the first substrate pad 212. That is to say, the third main pad 241 may not be wire-bonded with the first substrate pad 212. The third auxiliary pad 242 may be wire-bonded with the second substrate pad 213. The fifth buffer 243 may be coupled between the third main pad 241 and the third auxiliary pad 242. The sixth buffer 244 may be coupled with the third auxiliary pad 242 and the fifth buffer 243. The sixth buffer 244 may be coupled also with an internal circuit INT of the third semiconductor chip 240.

The fourth semiconductor chip 250 may include a fourth main pad 251, a fourth auxiliary pad 252, a seventh buffer 253, and an eighth buffer 254. In order for implementation of a present embodiment, it is sufficient that the fourth semiconductor chip 250 includes the fourth auxiliary pad 252 and the eighth buffer 254. Since the first to fourth semiconductor chips 220, 230, 240 and 250 may be manufactured and fabricated through the same processes and have the same configuration, it is illustrated that the fourth semiconductor chip 250 includes together the configuration of the fourth main pad 251 and the seventh buffer 253. The fourth main pad 251 may not be coupled directly with the first substrate pad 212. That is to say, the fourth main pad 251 may not be wire-bonded with the first substrate pad 212. The fourth auxiliary pad 252 may be wire-bonded with the second substrate pad 213. The seventh buffer 253 may be coupled between the fourth main pad 251 and the fourth auxiliary pad 252. The eighth buffer 254 may be coupled with the fourth auxiliary pad 252 and the seventh buffer 253. The eighth buffer 254 may be coupled also with an internal circuit INT of the fourth semiconductor chip 250.

In the case where the package ball 211 receives and outputs a bidirectional transmission signal, the first to eighth buffers 223, 224, 233, 234, 243, 244, 253 and 254 may be bidirectional transmission circuits. For example, the first to eighth buffers 223, 224, 233, 234, 243, 244, 253 and 254 may include transmitters and receivers. In the case where the package ball 211 receives a unidirectional transmission signal, the first to eighth buffers 223, 224, 233, 234, 243, 244, 253 and 254 may be unidirectional transmission circuits. For example, the first to eighth buffers 223, 224, 233, 234, 243, 244, 253 and 254 may include only receivers.

Operations in the case where the semiconductor apparatus 200 receives and outputs a bidirectional transmission signal will be described below. The semiconductor apparatus 200 may receive a signal through the package ball 211 from the external device. The signal may be inputted to the first buffer 223 through the first substrate pad 212 and the first main pad 221, and the first buffer 223 may buffer the signal and output the buffered signal to the second buffer 224 and the first auxiliary pad 222. The second buffer 224 may buffer the signal outputted from the first buffer 223, and provide the buffered signal to the internal circuit INT of the first semiconductor chip 220. Further, the signal outputted from the first buffer 223 may be provided to the fourth buffer 234, the sixth buffer 244 and the eighth buffer 254 through the first auxiliary pad 222, the second substrate pad 213 and the second to fourth auxiliary pads 232, 242 and 252. The fourth buffer 234 may buffer the signal outputted from the first buffer 223 through the second substrate pad 213 and the second auxiliary pad 232, and provide the buffered signal to the internal circuit INT of the second semiconductor chip 230. The sixth buffer 244 may buffer the signal outputted from the first buffer 223 through the second substrate pad 213 and the third auxiliary pad 242, and provide the buffered signal to the internal circuit INT of the third semiconductor chip 240. The eighth buffer 254 may buffer the signal outputted from the first buffer 223 through the second substrate pad 213 and the fourth auxiliary pad 252, and provide the buffered signal to the internal circuit INT of the fourth semiconductor chip 250.

The first buffer 223 may buffer the signal received from the external device, and transmit the buffered signal to the first to fourth semiconductor chips 220, 230, 240 and 250. Accordingly, signal transmission and/or reception between the semiconductor apparatus 200 and the external device may be performed through the first substrate pad 212, the first main pad 221 and the first buffer 223, and signal transmission and/or reception in the semiconductor apparatus 200 may be performed through the second substrate pad 213 and the respective auxiliary pads 222, 232, 242 and 252. Since the semiconductor apparatus 200 is coupled directly with the external device only through the first main pad 221 and the first buffer 223, a loading which the external device expects for the semiconductor apparatus 200 may be retained as a constant value even though the number of semiconductor chips included in the semiconductor apparatus 200 is increased.

A signal outputted from the internal circuit INT of the first semiconductor chip 220 may be buffered by the second buffer 224, and the buffered signal may be outputted to the first buffer 223. The first buffer 223 may buffer the signal received from the second buffer 224, and output the buffered signal to the first substrate pad 212 and the package ball 211 through the first main pad 221. Signals outputted from the internal circuits INT of the second to fourth semiconductor chips 230, 240 and 250 may be buffered by the fourth buffer 234, the sixth buffer 244 and the eighth buffer 254, and the buffered signals may be transmitted to the second substrate pad 213 through the second auxiliary pad 232, the third auxiliary pad 242 and the fourth auxiliary pad 252, respectively. The signals transmitted to the second substrate pad 213 may be inputted to the first buffer 223 through the first auxiliary pad 222. The first buffer 223 may buffer the signals received through the first auxiliary pad 222, and the buffered signals may be outputted to the first substrate pad 212 and the package ball 211 through the first main pad 221. Accordingly, the signals outputted from the internal circuits INT of the first to fourth semiconductor chips 220, 230, 240 and 250 may be buffered by the first buffer 223, and may be outputted to the external device sequentially through the first main pad 221, the first substrate pad 212 and the package ball 211.

Figure 3:
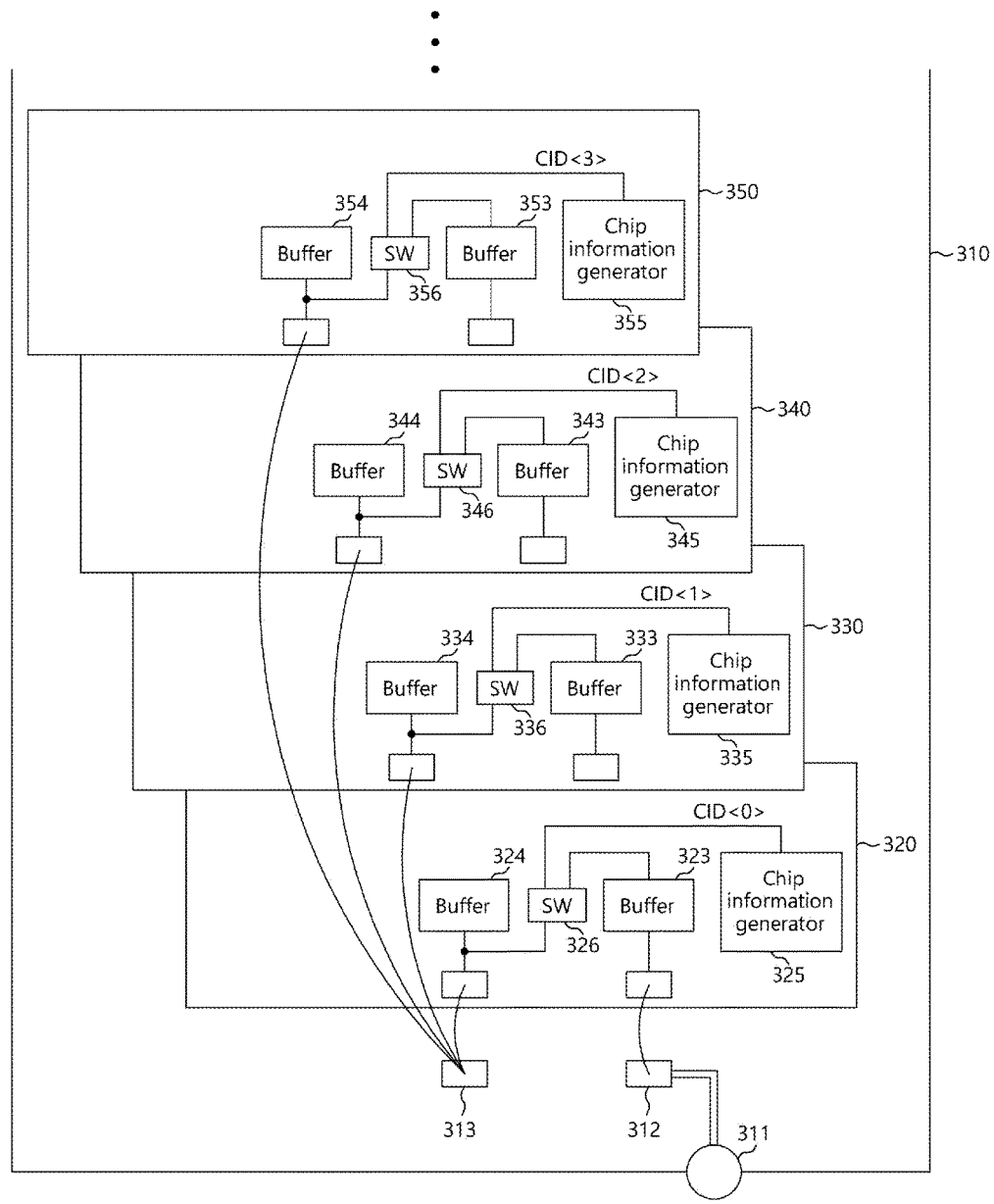
FIG. 3 is a diagram illustrating a representation of an example of the configuration of a semiconductor apparatus in accordance with an embodiment.

FIG. 3 is a diagram illustrating a representation of an example of the configuration of a semiconductor apparatus 300 in accordance with an embodiment. Referring to FIG. 3, the semiconductor apparatus 300 may include all the components of the semiconductor apparatus 200 illustrated in FIG. 2. Referring to FIG. 3, descriptions for components which overlap with the components of the semiconductor apparatus 200 illustrated in FIG. 2 will be omitted, and descriptions will be made for added components. Referring to FIG. 3, the components the same as or similar to the components of the semiconductor apparatus 200 illustrated in FIG. 2 are designated by similar reference numerals. Referring to FIG. 3, first to fourth semiconductor chips 320, 330, 340 and 350 may include chip information generators 325, 335, 345 and 355 and switches 326, 336, 346 and 356, respectively. The chip information generators 325, 335, 345 and 355 may generate and store different chip ID signals CID<0>, CID<1>, CID<2> and CID<3>. For example, the chip information generators 325, 335, 345 and 355 may generate different chip ID signals by being coupled with a plurality of power supply voltage pads. For example, when the semiconductor apparatus 300 includes the 4 semiconductor chips 320, 330, 340 and 350, the respective chip information generators 325, 335, 345 and 355 may be coupled with 2 power supply voltage pads (not illustrated) in different coupling patterns. The chip information generator 325 of the first semiconductor chip 320 may be wire-bonded with low voltage pads, and store a code of 0,0 as the chip ID signal CID<0> of the first semiconductor chip 320. The chip information generator 335 of the second semiconductor chip 330 may be wire-bonded with one low voltage pad and one high voltage pad, and store a code of 0,1 as the chip ID signal CID<1> of the second semiconductor chip 330. The chip information generator 345 of the third semiconductor chip 340 may be wire-bonded with one high voltage pad and one low voltage pad, and store a code of 1,0 as the chip ID signal CID<2> of the third semiconductor chip 340. The chip information generator 355 of the fourth semiconductor chip 350 may be wire-bonded with high voltage pads, and store a code of 1,1 as the chip ID signal CID<3> of the fourth semiconductor chip 350.

The switch 326 may selectively couple a first buffer 323 and a second buffer 324 based on the chip ID signal CID<0> of the first semiconductor chip 320 generated from the chip information generator 325. The switch 336 may selectively couple a third buffer 333 and a fourth buffer 334 based on the chip ID signal CID<1> of the second semiconductor chip 330 generated from the chip information generator 335. The switch 346 may selectively couple a fifth buffer 343 and a sixth buffer 344 based on the chip ID signal CID<2> of the third semiconductor chip 340 generated from the chip information generator 345. The switch 356 may selectively couple a seventh buffer 355 and an eighth buffer 354 based on the chip ID signal CID<3> of the fourth semiconductor chip 350 generated from the chip information generator 355. In a present embodiment, the switch 326 of the first semiconductor chip 320 which is coupled with a first substrate pad 312 may be turned on, and the switches 336, 346 and 356 of the second to fourth semiconductor chips 330, 340 and 350 which are not coupled directly with the first substrate pad 312 may be turned off. For example, the switches 326, 336, 346 and 356 may be turned on by only a chip ID signal associated with a semiconductor chip coupled directly with the first substrate pad 312. For example, all of the switches 326, 336, 346 and 356 may be turned on in response to only the code of 0,0. Therefore, the switch 326 of the first semiconductor chip 320 may be turned on, and the signal outputted from the first buffer 323 may be transmitted to the second to fourth semiconductor chips 330, 340 and 350 through a second substrate pad 313. All of the switches 336, 346 and 356 of the second to fourth semiconductor chips 330, 340 and 350 may be turned off, thereby blocking the third and fourth buffers 333 and 334 from each other, the fifth and sixth buffers 343 and 344 from each other and the seventh and eighth buffers 353 and 354 from each other. Therefore, an unnecessary loading which is likely to be added as the third buffer 333, the fifth buffer 343 and the seventh buffer 353 are coupled with the second substrate pad 313 may be decreased additionally.

Figure 4:
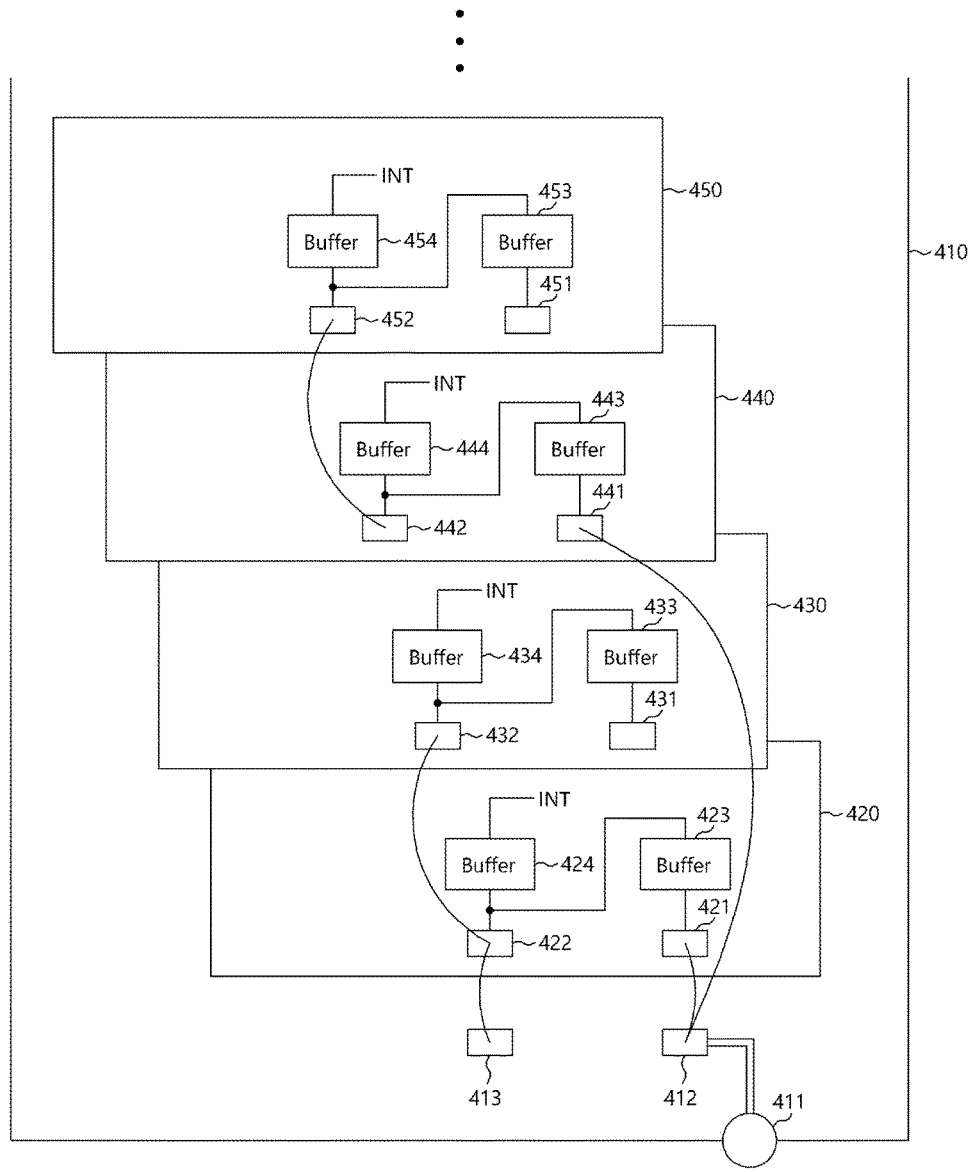
FIG. 4 is a diagram illustrating a representation of an example of the configuration of a semiconductor apparatus in accordance with an embodiment.

FIG. 4 is a diagram illustrating a representation of an example of the configuration of a semiconductor apparatus 400 in accordance with an embodiment. Referring to FIG. 4, the semiconductor apparatus 400 may include a package substrate 410 and a first semiconductor chip 420. Referring to FIG. 4, reference numerals similar to FIG. 2 may designate components the same or similar to the components of the semiconductor apparatus 200 illustrated in FIG. 2, and repeated descriptions will be omitted herein. The package substrate 410 may include a package ball 411, a first substrate pad 412, and a second substrate pad 413. The first semiconductor chip 420 may be stacked on the package substrate 410. The first semiconductor chip 420 may include a main pad 421, an auxiliary pad 422, a first buffer 423, and a second buffer 424. The main pad 421 may be wire-bonded with the first substrate pad 412, and the auxiliary pad 422 may be wire-bonded with the second substrate pad 413. The first buffer 423 may be coupled between the main pad 421 and the second buffer 424. The second buffer 424 may be coupled with the first buffer 423 and the auxiliary pad 422, and may be coupled also with an internal circuit INT of the first semiconductor chip 420.

The semiconductor apparatus 400 may further include a plurality of semiconductor chips which are sequentially stacked on the first semiconductor chip 420. The plurality of semiconductor chips may include substantially the same components as the first semiconductor chip 420. The first semiconductor chip 420 and the plurality of semiconductor chips may be classified into a predetermined number of groups. For example, the number of groups may be n (n is an integer equal to or greater than 2). In a present embodiment, the main pad of at least one semiconductor chip of each group is wire-bonded with the first substrate pad 412, the auxiliary pad of the at least one semiconductor chip of each group is wire-bonded with the second substrate pad 413, and the auxiliary pads of the semiconductor chips of each group may be wire-bonded with each other. The main pad of a remaining semiconductor chip of each group may not be wire-bonded with the first substrate pad 412. The auxiliary pad of the remaining semiconductor chip of each group may not be wire-bonded with the second substrate pad 413.

Referring to FIG. 4, the semiconductor apparatus 400 may further include second to fourth semiconductor chips 430, 440 and 450. The first and second semiconductor chips 420 and 430 may be classified into a first group, and the third and fourth semiconductor chips 440 and 450 may be classified into a second group. In the first group, the main pad 421 of the first semiconductor chip 420 may be wire-bonded with the first substrate pad 412, and the auxiliary pad 422 of the first semiconductor chip 420 may be wire-bonded with the second substrate pad 413. The main pad 431 of the second semiconductor chip 430 may not be wire-bonded with the first substrate pad 412 and the main pad 421 of the first semiconductor chip 420, and the auxiliary pad 432 of the second semiconductor chip 430 may be wire-bonded with the auxiliary pad 422 of the first semiconductor chip 420. In the second group, the main pad 441 of the third semiconductor chip 440 may be wire-bonded with the first substrate pad 412, and the auxiliary pad 442 of the third semiconductor chip 440 may not be wire-bonded with the second substrate pad 413. The main pad 451 of the fourth semiconductor chip 450 may not be wire-bonded with the first substrate pad 412 and the main pad 441 of the third semiconductor chip 440, and the auxiliary pad 452 of the fourth semiconductor chip 450 may be wire-bonded with the auxiliary pad 442 of the third semiconductor chip 440.

The main pad 421 of the first semiconductor chip 420 and the main pad 441 of the third semiconductor chip 440 may be respectively wire-bonded with the first substrate pad 412, and receive a signal transmitted from an external device (not illustrated), through the package ball 411. The buffer 423 of the first semiconductor chip 420 may buffer the signal received through the main pad 421 and provide the buffered signal to the auxiliary pad 422 such that the signal may be provided to not only the first semiconductor chip 420 but also the second semiconductor chip 430. A buffer 443 of the third semiconductor chip 440 may buffer the signal received through the main pad 441 and provide the buffered signal to the auxiliary pad 442 such that the signal may be provided to not only the third semiconductor chip 440 but also the fourth semiconductor chip 450. In a present embodiment, a loading which the external device expects for the semiconductor apparatus 400 may be a loading corresponding to 2 semiconductor chips (that is, the first semiconductor chip 420 and the third semiconductor chip 440). However, a loading which the buffer 423 and the auxiliary pad 422 of the first semiconductor chip 420 expect may be reduced to one half when compared to the cases of the semiconductor apparatuses 200 and 300 of FIGS. 2 and 3. Therefore, no limitation may exist when designing the buffer 423 of the first semiconductor chip 420, and signal transmission may be precisely implemented in the semiconductor apparatus 400.

Figure 5:
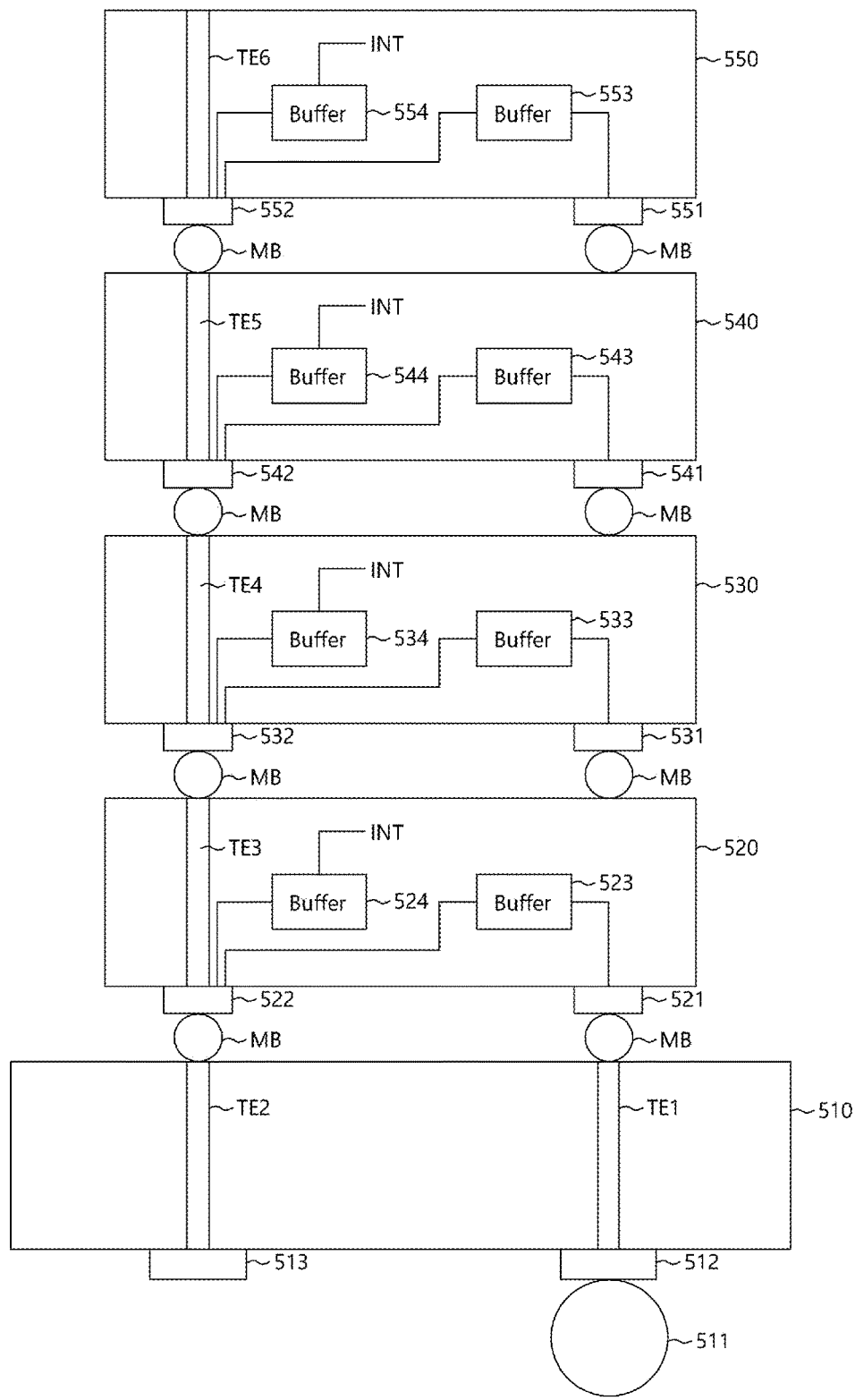
FIG. 5 is a diagram illustrating a representation of an example of the configuration of a semiconductor apparatus in accordance with an embodiment.

FIG. 5 is a diagram illustrating a representation of an example of the configuration of a semiconductor apparatus 500 in accordance with an embodiment. Referring to FIG. 5, the semiconductor apparatus 500 may include the same components as the semiconductor apparatus 200 illustrated in FIG. 2, and may have a configuration in which a plurality of semiconductor chips are coupled through not wire bonding but through electrodes such as through-silicon vias. Referring to FIG. 5, the semiconductor apparatus 500 may include a base chip 510 and a plurality of stacked semiconductor chips 520, 530, 540 and 550. The base chip 510 may be an interposer or a package substrate. The base chip 510 may correspond to the package substrate 210 illustrated in FIG. 2. The first to fourth stacked semiconductor chips 520, 530, 540 and 550 may correspond to the first to fourth semiconductor chips 220, 230, 240 and 250, respectively, illustrated in FIG. 2. The base chip 510 may be coupled with an external device through a package ball 511 such as a bump ball, and may communicate with the external device through the package ball 511. The base chip 510 may include a first substrate pad 512 and a second substrate pad 513. The first substrate pad 512 may be coupled with the package ball 511, and receive a signal from the external device or output a signal to the external device. The second substrate pad 513 may not be coupled with a package ball, and may not be coupled with the external device.

The first to fourth semiconductor chips 520, 530, 540 and 550 may be sequentially stacked on the base chip 510. Micro bumps MB may be disposed between the first to fourth semiconductor chips 520, 530, 540 and 550 to allow the first to fourth semiconductor chips 520, 530, 540 and 550 to be stacked upon one another and the stacked first to fourth semiconductor chips 520, 530, 540 and 550 to be electrically coupled with one another. The first semiconductor chip 520 may include a first main pad 521, a first auxiliary pad 522, a first buffer 523, and a second buffer 524. The second semiconductor chip 530 may include a second main pad 531, a second auxiliary pad 532, a third buffer 533, and a fourth buffer 534. The third semiconductor chip 540 may include a third main pad 541, a third auxiliary pad 542, a fifth buffer 543, and a sixth buffer 544. The fourth semiconductor chip 550 may include a fourth main pad 551, a fourth auxiliary pad 552, a seventh buffer 553, and an eighth buffer 554. The first main pad 521 may be coupled with the first substrate pad 512 through a through electrode TE1 which is formed in the base chip 510. The second to fourth main pads 531, 541 and 551 may not be coupled with through electrodes. The first auxiliary pad 522 may not be coupled directly with the first substrate pad 512. The first auxiliary pad 522 may be coupled with the second substrate pad 513 through another through electrode TE2 which is formed in the base chip 510. The second to fourth auxiliary pads 532, 542 and 552 may be coupled with the first auxiliary pad 522 and the second substrate pad 513 through through electrodes TE3, TE4 and TE5 which are formed in the first to third semiconductor chips 520, 530 and 540, respectively.

The first buffer 523 may be coupled with the first main pad 521 and the first auxiliary pad 522, and may be coupled also with the through electrode TE3 formed in the first semiconductor chip 520 and the second buffer 524. The second buffer 524 may be coupled with the first auxiliary pad 522 and the through electrode TE3, and may be coupled also with an internal circuit INT of the first semiconductor chip 520. The third buffer 533 may be coupled with the second main pad 531 and the second auxiliary pad 532, and may be coupled also with the through electrode TE4 formed in the second semiconductor chip 530 and the fourth buffer 534. The fourth buffer 534 may be coupled with the second auxiliary pad 532 and the through electrode TE4, and may be coupled also with an internal circuit INT of the second semiconductor chip 530. The fifth buffer 543 may be coupled with the third main pad 541 and the third auxiliary pad 542, and may be coupled also with the through electrode TE5 formed in the third semiconductor chip 540 and the sixth buffer 544. The sixth buffer 544 may be coupled with the third auxiliary pad 542 and the through electrode TE5, and may be coupled also with an internal circuit INT of the third semiconductor chip 540. The seventh buffer 553 may be coupled with the fourth main pad 551 and the fourth auxiliary pad 552, and may be coupled also with a through electrode TE6 formed in the fourth semiconductor chip 550 and the eighth buffer 554. The eighth buffer 554 may be coupled with the fourth auxiliary pad 552 and the through electrode TE6, and may be coupled also with an internal circuit INT of the fourth semiconductor chip 550.

Referring to FIG. 5, the semiconductor apparatus 500 may be electrically coupled through through electrodes in replacement of the electrical coupling of the first to fourth semiconductor apparatuses 100, 200, 300 and 400 through wire bonding. The first main pad 521 of the first semiconductor chip 520 may be coupled with the first substrate pad 512 and the package ball 511 through the through electrode TE1, but the second to fourth main pads 531, 541 and 551 of the second to fourth semiconductor chips 530, 540 and 550 may not be coupled directly with the first main pad 521 and the first substrate pad 512. Therefore, a loading which the external device coupled with the package ball 511 expects for the semiconductor apparatus 500 may be reduced efficiently.

Figure 6:
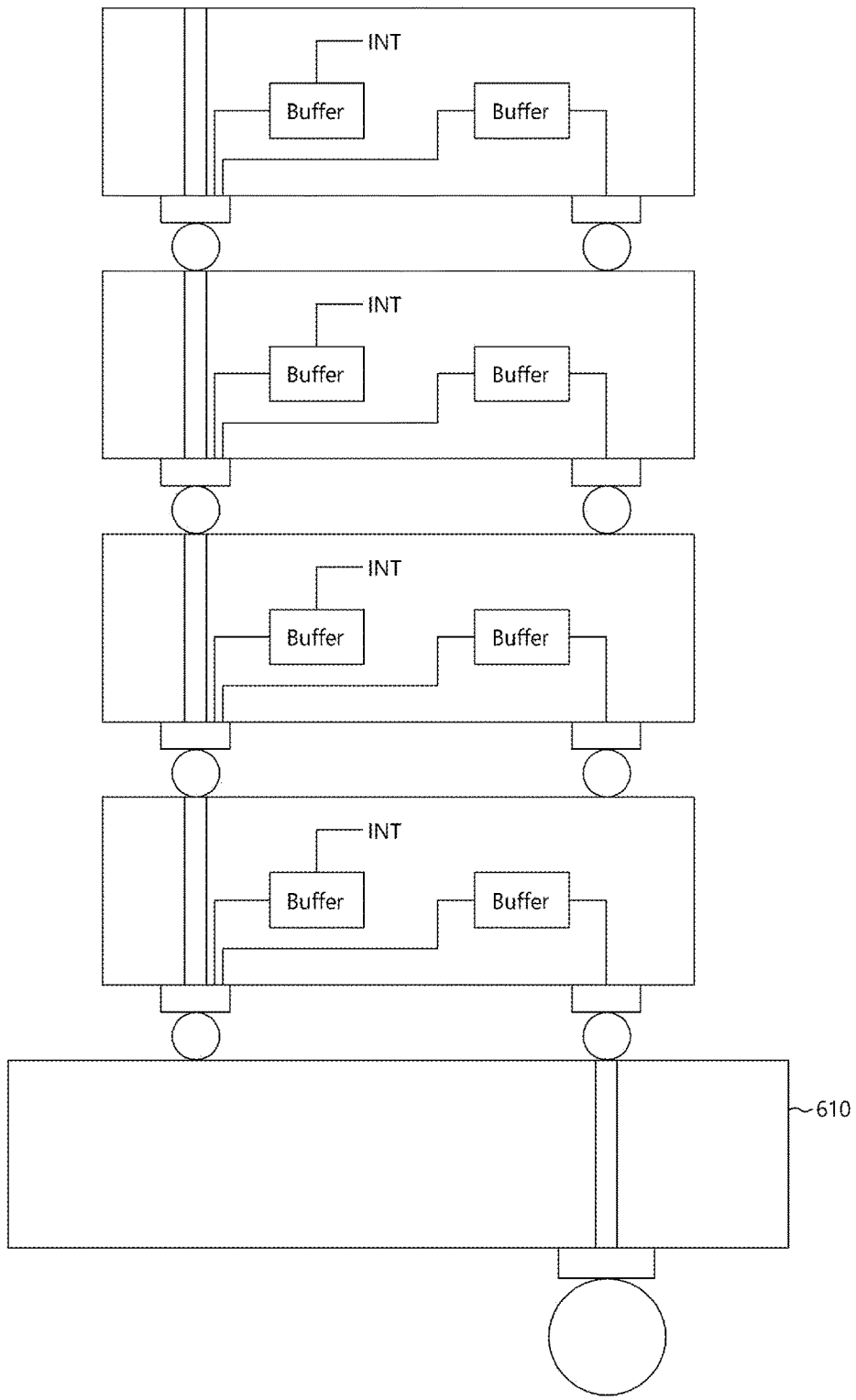
FIG. 6 is a diagram illustrating a representation of an example of the configuration of a semiconductor apparatus in accordance with an embodiment.

FIG. 6 is a diagram illustrating a representation of an example of the configuration of a semiconductor apparatus 600 in accordance with an embodiment. Referring to FIG. 6, while the semiconductor apparatus 600 has substantially the same structure as the semiconductor apparatus 500 of FIG. 5, there may be a difference in terms of the structure of a base chip. In the semiconductor apparatuses 100, 200, 300 and 400 illustrated in FIGS. 1 to 4, pads may be coupled through wire bonding. Therefore, in order for easy packaging, respective auxiliary pads may be wire-bonded with the substrate pad provided in a package substrate. However, in a package which uses through electrodes, respective auxiliary pads have little need to be coupled with a substrate pad. In a semiconductor apparatus which uses wire bonding, since a substrate pad is disposed inside a package substrate, the area of a package does not increase even when a plurality of substrate pads are formed. Conversely, in a semiconductor apparatus which uses through electrodes, since a substrate pad to be coupled with a package ball is disposed outside a package substrate and the size of the package ball to be coupled with the substrate pad is substantially large, the area of the package substrate and a package may increase. Thus, referring to FIG. 6, a base chip 610 of the semiconductor apparatus 600 may not include the second substrate pad 513 and the through electrode TE2 unlike the semiconductor apparatus 500 of FIG. 5.

Figure 7:
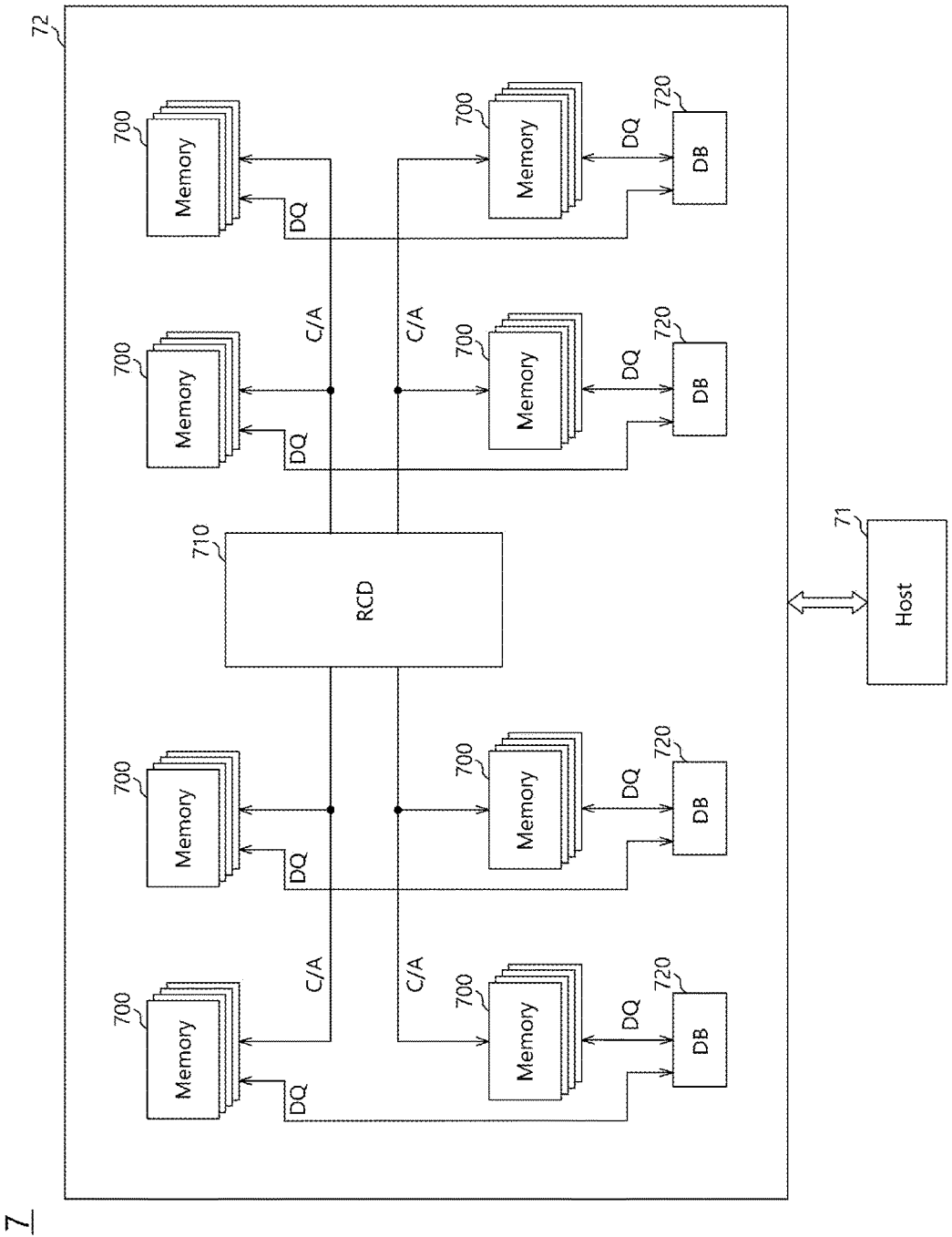
FIG. 7 is a diagram illustrating a representation of an example of the configuration of a semiconductor system in accordance with an embodiment.

FIG. 7 is a diagram illustrating a representation of an example of the configuration of a semiconductor system 7 in accordance with an embodiment. Referring to FIG. 7, the semiconductor system 7 may include a host 71 and a memory module 72. The host 71 may be a master device capable of controlling the memory module 72, and the memory module 72 may be a slave device which performs various operations by being controlled by the host 71. The host 71 may provide various signals such as a request, a command, an address signal and data to control the memory module 72. The host 71 may include a central processing unit (CPU), a graphic processing unit (GPU), a multimedia processor (MMP) or a digital signal processor (DSP). The host 71 may be realized in the form of a system-on-chip by combining processor chips having various functions, such as application processors (AP). The host 71 may be a memory controller.

The memory module 72 may include a plurality of memory apparatuses 700. Each memory apparatus 700 may include a volatile memory and a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM). In particular, each memory apparatus 700 may be a stack type memory apparatus in which a plurality of chips are stacked. The respective semiconductor apparatuses 100, 200, 300, 400, 500 and 600 illustrated in FIGS. 1 to 6 may be applied as the memory apparatus 700.

The memory module 72 may further include a register clock driver (RCD) 710 and a plurality of data buffers (DB) 720. Since the memory module 72 includes the register clock driver 710 and the data buffers 720, the memory module 72 may be a load reduced dual in-line memory module (LRDIMM). However, the type of the memory module 72 is not limited specifically, and the spirit of the present disclosure may be applied in the same or similar manner even to memory modules such as an unbuffered DIMM (UDIMM), a registered DIMM (RDIMM) and a small outline DIMM (SODIMM). Also, the spirit of the present disclosure may be applied in the same or similar manner even to any DIMM which adopts an advanced memory buffer (AMB) capable of performing the function of a host or a controller. The register clock driver 710 may buffer a command and address signal C/A received from the host 71, and may provide the command and address signal C/A to the plurality of memory apparatuses 700. Moreover, while not illustrated, the register clock driver 710 may buffer a clock signal received from the host 71, and may provide the clock signal to the plurality of memory apparatuses 700. The data buffers 720 may buffer data DQ received from the host 71, and may provide the data DQ to the plurality of memory apparatuses 700. The register clock driver 710 may be a unidirectional signal transmission circuit, and the data buffers 720 may be bidirectional signal transmission circuits.

The register clock driver 710 may be coupled with the plurality of memory apparatuses 700, respectively. For example, in FIG. 7, when the memory module 72 includes 8 memory apparatuses 700 and each memory apparatus 700 is a stack type memory apparatus in which 4 memory chips are stacked, the register clock driver 710 may expect a loading corresponding to total 32 memory chips. However, in the case where the configurations of the semiconductor apparatuses 100, 200, 300, 500 and 600 of FIGS. 1-3, 5, and 6 are applied to the memory apparatuses 700, the register clock driver 710 may expect only a loading corresponding to 8 memory chips. In the case where the configurations of the semiconductor apparatus 400 of FIG. 4 is applied to the memory apparatuses 700, the register clock driver 710 may expect only a loading corresponding to 16 memory chips. Therefore, the command and address signal C/A may be transmitted precisely from the register clock driver 710 to the memory apparatuses 700. Similarly, the data buffers 720 may be coupled with the respective memory apparatuses 700. For example, each data buffer 720 may be coupled with 2 memory apparatuses 700. Each data buffer 720 may expect a loading corresponding to total 8 memory chips. However, in the case where the configurations of the semiconductor apparatuses 100, 200, 300, 500 and 600 of FIGS. 1-3, 5, and 6 are applied to the memory apparatuses 700, each data buffer 720 may expect only a loading corresponding to 2 memory chips. in the case where the configurations of the semiconductor apparatus 400 of FIG. 4 is applied to the memory apparatuses 700, each data buffer 720 may expect only a loading corresponding to 4 memory chips. Therefore, data may be transmitted and received precisely between the data buffers 720 and the memory apparatuses 700.

While various embodiments have been described above, it will be understood to those skilled in the art that the embodiments described are examples only. Accordingly, the semiconductor apparatus and the semiconductor system including the same described herein should not be limited based on the described embodiments.

What is claimed is:
1. A semiconductor apparatus comprising:
a package substrate; and
a semiconductor chip,
wherein the package substrate comprises:
   a first substrate pad coupled with a package ball; and
   a second substrate pad, and
wherein the semiconductor chip comprises:
   a main pad coupled with the first substrate pad;
   an auxiliary pad coupled with the second substrate pad; and a first buffer coupled with the main pad and the auxiliary pad.

2. The semiconductor apparatus according to claim 1, wherein transmission of a signal from the semiconductor chip to an external of the semiconductor chip is performed through the first substrate pad, and
wherein reception of a signal received externally from the semiconductor chip is performed through the first substrate pad.

3. The semiconductor apparatus according to claim 1, wherein the main pad is wire-bonded with the first substrate pad, the auxiliary pad is wire-bonded with the second substrate pad, and the main pad and the auxiliary pad are indirectly coupled with each other.

4. The semiconductor apparatus according to claim 1, wherein the main pad is coupled with the first substrate pad through a through electrode, and the main pad and the auxiliary pad are not coupled directly with each other.

5. The semiconductor apparatus according to claim 1, further comprising:
a second buffer coupled with the first buffer, the auxiliary pad and an internal circuit of the semiconductor chip.

6. The semiconductor apparatus according to claim 5, wherein the second buffer buffers a signal outputted from the first buffer and provides the buffered signal to the internal circuit of the semiconductor chip, or buffers a signal outputted from the internal circuit and provides the buffered signal to the first buffer.

7. A semiconductor apparatus comprising:
a package substrate; and
a first semiconductor chip and a second semiconductor chip stacked with the package substrate,
wherein the package substrate comprises:
a first substrate pad coupled with a package ball; and
a second substrate pad,
wherein the first semiconductor chip comprises:
a first main pad coupled with the first substrate pad;
a first auxiliary pad coupled with the second substrate pad;
a first buffer coupled with the first main pad; and
a second buffer coupled with the first buffer and the first auxiliary pad, and
wherein the second semiconductor chip comprises:
a second auxiliary pad coupled with the second substrate pad.

8. The semiconductor apparatus according to claim 7, wherein transmission of a signal from the semiconductor chip to an external of the semiconductor chip is performed through the first substrate pad, and
wherein reception of a signal received externally from the semiconductor chip is performed through the first substrate pad.

9. The semiconductor apparatus according to claim 7, wherein the first main pad is wire-bonded with the first substrate pad, the first auxiliary pad is wire-bonded with the second substrate pad, and the first main pad is indirectly coupled with the first auxiliary pad.

10. The semiconductor apparatus according to claim 7, wherein the second buffer buffers a signal outputted from the first buffer and provides the buffered signal to an internal circuit of the first semiconductor chip, or buffer a signal outputted from the internal circuit and provides the buffered signal to the first buffer.

11. The semiconductor apparatus according to claim 7, wherein the second auxiliary pad is wire-bonded with the second substrate pad.

12. The semiconductor apparatus according to claim 11, further comprising:
a plurality of semiconductor chips stacked with the first and second semiconductor chips over the package substrate,
wherein each of the plurality of semiconductor chips comprises an auxiliary pad, and
wherein the auxiliary pad of each of the plurality of semiconductor chips is wire-bonded with the second substrate pad.

13. The semiconductor apparatus according to claim 12, wherein the second semiconductor chip further comprises a second main pad, and each of the plurality of semiconductor chips further comprises a main pad, and
wherein the second main pad and main pads of the plurality of semiconductor chips are not wire-bonded with the first substrate pad.

14. The semiconductor apparatus according to claim 13, further comprising:
a plurality of semiconductor chips stacked with the first and second semiconductor chips over the package substrate,
wherein each of the plurality of semiconductor chips comprises an auxiliary pad, and
wherein the auxiliary pad of each of the plurality of semiconductor chips is wire-bonded with the second substrate pad.

15. The semiconductor apparatus according to claim 7, wherein the second semiconductor chip further comprises:
a second main pad;
a third buffer coupled with the second main pad; and
a fourth buffer coupled with the third buffer and the second auxiliary pad, and
wherein the second main pad is not wire-bonded with the first substrate pad.

16. A semiconductor apparatus comprising:
a package substrate; and
a first semiconductor chip stacked over the package substrate,
wherein the package substrate comprises:
a first substrate pad which is coupled with a package ball, and
wherein the first semiconductor chip comprises:
a main pad coupled with the first substrate pad;
an auxiliary pad; and
a buffer configured to couple the main pad and the auxiliary pad.

17. The semiconductor apparatus according to claim 16, wherein the package substrate further comprises a second substrate pad,
wherein the semiconductor apparatus further comprises a plurality of semiconductor chips which are stacked with the first semiconductor chip,
wherein each of the plurality of semiconductor chips comprises a main pad and an auxiliary pad, and
wherein respective auxiliary pads of the plurality of semiconductor chips are wire-bonded with the second substrate pad, and main pads of the plurality of semiconductor chips are not wire-bonded with the first substrate pad.

18. The semiconductor apparatus according to claim 16, wherein the semiconductor apparatus further comprises a plurality of semiconductor chips which are stacked with the first semiconductor chip,
wherein each of the plurality of semiconductor chips comprises a main pad and an auxiliary pad, and wherein respective auxiliary pads of the plurality of semiconductor chips are coupled with one another through through electrodes, and main pads of the plurality of semiconductor chips are indirectly coupled with the first main pad and the first substrate pad.

19. The semiconductor apparatus according to claim 16,
wherein the package substrate further comprises a second substrate pad,
wherein the semiconductor apparatus further comprises a plurality of semiconductor chips which are stacked with the first semiconductor chip,
wherein each of the plurality of semiconductor chips comprises a main pad and an auxiliary pad,
wherein the first semiconductor chip and the plurality of semiconductor chips are classified into first to n^th groups, the main pad of at least one semiconductor chip of each group is wire-bonded with the first substrate pad, the auxiliary pad of the at least one semiconductor chip is wire-bonded with the second substrate pad, and the auxiliary pads of semiconductor chips of each group are wire-bonded with each other, and
wherein n is an integer equal to or greater than two.

* * * * *